(12) United States Patent
Xiao et al.

(10) Patent No.: US 11,348,500 B2
(45) Date of Patent: May 31, 2022

(54) SHIFT REGISTER UNIT, SCAN DRIVING CIRCUIT, ARRAY SUBSTRATE, DISPLAY DEVICE, AND DRIVING METHOD

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Lijun Xiao, Beijing (CN); Qian Qian, Beijing (CN); Shaohong Gao, Beijing (CN); Tao Zhou, Beijing (CN); Chuan Ji, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 757 days.

(21) Appl. No.: 16/315,904

(22) PCT Filed: Mar. 12, 2018

(86) PCT No.: PCT/CN2018/078661
§ 371 (c)(1),
(2) Date: Jan. 7, 2019

(87) PCT Pub. No.: WO2019/015336
PCT Pub. Date: Jan. 24, 2019

(65) Prior Publication Data
US 2021/0358356 A1  Nov. 18, 2021

(30) Foreign Application Priority Data

Jul. 17, 2017  (CN) .......................... 201710582688.2

(51) Int. Cl.
*G11C 19/28* (2006.01)
*G09G 3/20* (2006.01)

(52) U.S. Cl.
CPC ............. *G09G 3/20* (2013.01); *G11C 19/287* (2013.01); *G09G 2310/0286* (2013.01); *G09G 2310/08* (2013.01); *G11C 19/28* (2013.01)

(58) Field of Classification Search
CPC ............. G09G 3/20; G09G 2310/0286; G09G 2310/08; G11C 19/287; G11C 19/28
See application file for complete search history.

(56) References Cited

U.S. PATENT DOCUMENTS

| 2010/0177023 | A1 | 7/2010 | Han | |
|---|---|---|---|---|
| 2016/0267864 | A1* | 9/2016 | Xiao | ..................... G09G 3/3648 |
| 2021/0110757 | A1* | 4/2021 | Zhang | .................. G09G 3/2092 |

FOREIGN PATENT DOCUMENTS

| CN | 101533623 A | 9/2009 |
|---|---|---|
| CN | 103247275 A | 8/2013 |

(Continued)

OTHER PUBLICATIONS

International Search Report and Written Opinion dated May 30, 2018; PCT/CN2018/078661.

*Primary Examiner* — Patrick N Edouard
*Assistant Examiner* — Douglas M Wilson

(57) ABSTRACT

A shift register unit, a scan driving circuit, an array substrate, a display device, and a driving method are provided. The shift register unit includes an input circuit, a replacement circuit, an output circuit, and a pull-down circuit; the input circuit is respectively connected to the input terminal and the first node, and is configured to set the first node to an active level when the input terminal (IN) is at an active level; the replacement circuit is respectively connected to the input terminal and the second node, and is configured to set the (Continued)

second node to an inactive level when the input terminal is at an active level.

10 Claims, 9 Drawing Sheets

(56) References Cited

FOREIGN PATENT DOCUMENTS

| CN | 103456365 A | | 12/2013 | |
|---|---|---|---|---|
| CN | 105741740 A | * | 7/2016 | ............... G09G 3/20 |
| CN | 105741740 A | | 7/2016 | |
| CN | 105810170 A | | 7/2016 | |
| CN | 107146570 A | | 9/2017 | |

* cited by examiner

SHIFT REGISTER UNIT, SCAN DRIVING CIRCUIT, ARRAY SUBSTRATE, DISPLAY DEVICE, AND DRIVING METHOD

The present application claims priority to the Chinese patent application No. 201710582688.2, filed on Jul. 17, 2017, the entire disclosure of which is incorporated herein by reference as part of the present application.

TECHNICAL FIELD

Embodiments of the present disclosure relate to a shift register unit, a scan driving circuit, an array substrate, a display device, and a driving method.

BACKGROUND

Compared with traditional technologies, the Gate driver On Array (GOA) technology can not only save a circuit board carrying the gate driver and realize a symmetrical design on both sides of a display panel, for example, but also can save wiring areas of a chip bonding area and a fan-out area on the edge of the display panel and is beneficial to realize a narrow border. Also, because the GOA technology can omit the chip bonding process in a row direction, it is also greatly helpful to improve the overall productivity and yield.

SUMMARY

At least one embodiment of the present disclosure provides a shift register unit, which includes an input terminal, an output terminal, an input circuit, a replacement circuit, an output circuit, and a pull-down circuit. The input circuit is respectively connected to the input terminal and a first node, and is configured to set the first node to an active level when the input terminal is at an active level; the replacement circuit is respectively connected to the input terminal and a second node, and is configured to set the second node to an inactive level when the input terminal is at an active level; the output circuit is respectively connected to the first node and the output terminal, and is configured to set the output terminal to an active level by using a clock signal when the first node is at an active level; and the pull-down circuit is respectively connected to the first node, the output terminal, and the second node, and is configured to set the first node to an inactive level and the output terminal to an inactive level when the second node is at an active level.

For example, in the shift register unit provided by an embodiment of the present disclosure, the replacement circuit includes a first transistor, a gate electrode of the first transistor is connected to the input terminal, a first electrode of the first transistor is connected to the second node, and a second electrode of the first transistor is connected for the inactive level of the second node.

For example, the shift register unit provided by an embodiment of the present disclosure further includes a pull-down control circuit; the pull-down control circuit is respectively connected to the first node and the second node, and is configured to set the second node to the inactive level when the first node is at the active level, and use the clock signal to set the second node to the active level when the first node is at an inactive level.

For example, the shift register unit provided by an embodiment of the present disclosure further includes a reset terminal and a reset circuit; the reset circuit is respectively connected to the reset terminal, and the first node and the output terminal, and is configured to set the first node to the inactive level and the output terminal to the inactive level when the reset terminal is at an active level.

For example, in the shift register unit provided by an embodiment of the present disclosure, the input circuit includes a second transistor, a gate electrode of the second transistor is connected to the input terminal, a first electrode of the second transistor is connected to the input terminal or connected for the active level of the first node, and a second electrode of the second transistor is connected to the first node.

For example, in the shift register unit provided by an embodiment of the present disclosure, the output circuit includes a third transistor and a first capacitor; a gate electrode of the third transistor is connected to the first node, a first electrode of the third transistor is connected to a first clock signal line, and a second electrode of the third transistor is connected to the output terminal; and a first terminal of the first capacitor is connected to the first node, and a second terminal of the first capacitor is connected to the output terminal.

For example, in the shift register unit provided by an embodiment of the present disclosure, the reset circuit includes a fourth transistor and a fifth transistor, a gate electrode of the fourth transistor is connected to the reset terminal, a first electrode of the fourth transistor is connected to the first node, and a second electrode of the fourth transistor is connected for the inactive level of the first node; and a gate electrode of the fifth transistor is connected to the reset terminal, a first electrode of the fifth transistor is connected to the output terminal, and a second electrode of the fifth transistor is connected for the inactive level of the output terminal.

For example, in the shift register unit provided by an embodiment of the present disclosure, the pull-down circuit includes a sixth transistor and a seventh transistor, a gate electrode of the sixth transistor is connected to the second node, a first electrode of the sixth transistor is connected to the first node, and a second electrode of the sixth transistor is connected for the inactive level of the first node; and a gate electrode of the seventh transistor is connected to the second node, a first electrode of the seventh transistor is connected to the output terminal, and a second electrode of the seventh transistor is connected for the inactive level of the output terminal.

For example, in the shift register unit provided by an embodiment of the present disclosure, the pull-down control circuit includes an eighth transistor, a ninth transistor, a tenth transistor, and an eleventh transistor, a gate electrode of the eighth transistor is connected to the first node, a first electrode of the eighth transistor is connected to the second node, and a second electrode of the eighth transistor is connected for the inactive level of the second node; a gate electrode of the ninth transistor is connected to a third node, a first electrode of the ninth transistor is connected to a second clock signal line, and a second electrode of the ninth transistor is connected to the second node; a gate electrode of the tenth transistor is connected to the first node, a first electrode of the tenth transistor is connected to the third node, and a second electrode of the tenth transistor is connected for a gate turn-off voltage; and a gate electrode of the eleventh transistor is connected to the second clock signal line, a first electrode of the eleventh transistor is connected to the second clock signal line, and a second electrode of the eleventh transistor is connected to the third node.

For example, in the shift register unit provided by an embodiment of the present disclosure, the input circuit includes a second transistor, the output circuit includes a third transistor and a first capacitor, the reset circuit includes a fourth transistor and a fifth transistor, the pull-down circuit includes a sixth transistor and a seventh transistor, and the pull-down control circuit includes an eighth transistor, a ninth transistor, a tenth transistor, and an eleventh transistor, a gate electrode of the second transistor is connected to the input terminal, a first electrode of the second transistor is connected to the input terminal or connected for the active level of the first node, and a second electrode of the second transistor is connected to the first node; a gate electrode of the third transistor is connected to the first node, a first electrode of the third transistor is connected to a first clock signal line, and a second electrode of the third transistor is connected to the output terminal; a first terminal of the first capacitor is connected to the first node, and a second terminal of the first capacitor is connected to the output terminal; a gate electrode of the fourth transistor is connected to the reset terminal, a first electrode of the fourth transistor is connected to the first node, and a second electrode of the fourth transistor is connected for the inactive level of the first node; a gate electrode of the fifth transistor is connected to the reset terminal, a first electrode of the fifth transistor is connected to the output terminal, and a second electrode of the fifth transistor is connected for the inactive level of the output terminal; a gate electrode of the sixth transistor is connected to the second node, a first electrode of the sixth transistor is connected to the first node, and a second electrode of the sixth transistor is connected for the inactive level of the first node; a gate electrode of the seventh transistor is connected to the second node, a first electrode of the seventh transistor is connected to the output terminal, and a second electrode of the seventh transistor is connected for the inactive level of the output terminal; a gate electrode of the eighth transistor is connected to the first node, a first electrode of the eighth transistor is connected to the second node, and a second electrode of the eighth transistor is connected for the inactive level of the second node; a gate electrode of the ninth transistor is connected to a third node, a first electrode of the ninth transistor is connected to a second clock signal line, and a second electrode of the ninth transistor is connected to the second node; a gate electrode of the tenth transistor is connected to the first node, a first electrode of the tenth transistor is connected to the third node, and a second electrode of the tenth transistor is connected for a gate turn-off voltage; a gate electrode of the eleventh transistor is connected to the second clock signal line, a first electrode of the eleventh transistor is connected to the second clock signal line, and a second electrode of the eleventh transistor is connected to the third node; and the first clock signal line and the second clock signal line are respectively configured to transmitting one and other one of a positive phase clock signal and an inverted clock signal.

For example, the shift register unit provided by an embodiment of the present disclosure further includes an output noise reduction circuit; the output noise reduction circuit is respectively connected to the second clock signal line and the output terminal, and is configured to set the output terminal to an inactive level when the second clock signal line is at an active level.

For example, in the shift register unit provided by an embodiment of the present disclosure, the output noise reduction circuit includes the twelfth transistor, a gate electrode of the twelfth transistor is connected to the second clock signal line, a first electrode of the twelfth transistor is connected to the output terminal, and a second electrode of the twelfth transistor is connected for the inactive level of the output terminal.

For example, the shift register unit provided by an embodiment of the present disclosure further includes a pull-up control circuit, wherein the pull-up control circuit is respectively connected to the second clock signal line, the input terminal and the first node, and is configured to charge the first node or reduce noise of the first node.

For example, in the shift register unit provided by an embodiment of the present disclosure, the pull-up control circuit includes a thirteenth transistor, a gate electrode of the thirteenth transistor is connected to the second clock signal line, a first electrode of the thirteenth transistor is connected to the input terminal, and a second electrode of the thirteenth transistor is connected to the first node.

At least one embodiment of the present disclosure further provides a scan driving circuit, which includes a plurality of cascaded shift register units as provided by the embodiments of the present disclosure.

For example, in the scan driving circuit provided by an embodiment of the present disclosure, an input terminal of a shift register unit in each of remaining stages except for a first stage is connected to an output terminal of a shift register unit in a previous stage.

At least one embodiment of the present disclosure further provides an array substrate, which includes the scan driving circuit as provided by the embodiments of the present disclosure.

At least one embodiment of the present disclosure further provides a display device, which includes the array substrate as provided by the embodiments of the present disclosure.

At least one embodiment of the present disclosure further provides a driving method of the shift register unit, which includes that: in an input phase, by the input circuit, setting the first node to the active level when the input terminal is at the active level, and by the replacement circuit, setting the second node to the inactive level when the input terminal is at the active level; in an output phase, by the output circuit, setting the output terminal to the active level by using a clock signal when the first node is at the active level; and in a reset phase, by the pull-down circuit, setting the first node to the inactive level and the output terminal to the inactive level when the second node is at the active level.

BRIEF DESCRIPTION OF THE DRAWINGS

In order to clearly illustrate the technical solution of the embodiments of the present disclosure, the embodiments or the drawings of the related technical description will be briefly described in the following, it is obvious that the described drawings are only related to some embodiments of the present disclosure and thus are not limitative of the present disclosure.

DETAILED DESCRIPTION

Figure 1:
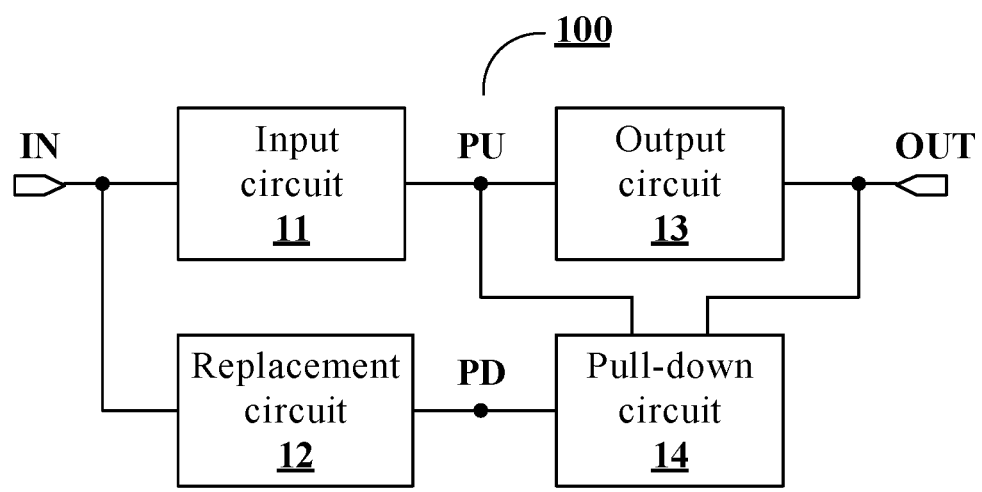
FIG. 1 is a structural block diagram of a shift register unit provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

It should be noted that the transistors used in the embodiments of the present disclosure may all be thin film transistors or field effect transistors or other switching devices with the characteristics similar to the thin film transistors or the field effect transistors, and the embodiments of the present disclosure can be described by taking the thin film transistor as an example. A source electrode and a drain electrode of the transistor used here can be symmetrical in configuration, so the structure of the source electrode and the drain electrode of the transistor may be indistinguishable. In the embodiments of the present disclosure, in order to distinguish the two electrodes of the transistor except a gate electrode, one of the electrodes is referred to as the first electrode described directly, and the other is referred to as the second electrode. In addition, the transistor used in the embodiments of the present disclosure may include any one of a P-type transistor and an N-type transistor, the P-type transistor is turned on when a gate electrode of the P-type transistor is at a low level, and is turned off when the gate electrode of the P-type transistor is at a high level, and the N-type transistor is turned on when the gate electrode of the N-type transistor is at a high level, and is turned off when the gate electrode of the N-type transistor is at a low level.

In a shift register unit, a pull-up node (Pull-Up) is usually used to control the output of a gate driving signal, so it is at an active level when the gate driving signal needs to be output; and a pull-down node (Pull-Down) is generally used to control the reset of the level of the pull-up node and the level of an output terminal, so it needs to be at an active level before and after outputting the gate driving signal. Therefore, before outputting the gate driving signal, the pull-down node needs to be converted from an active level to an inactive level, and also, the pull-up node needs to be converted from an inactive level to an active level. During this process, the reset effect of the pull-down node on the level of the pull-up node may affect the level conversion speed of the pull-up node. In addition, under the influence of factors such as process defects and device performance degradation and so on, the level conversion speed of the pull-up node may be further slowed down, and there may even appear the case where the pull-up node may not reach an active level, thereby resulting in an abnormal output of the shift register unit and causing display failure.

At least an embodiment of the present disclosure provides a shift register unit, which includes an input circuit, a replacement circuit, an output circuit, and a pull-down circuit. At least an embodiment of the present disclosure also provides a scan driving circuit, an array substrate, a display device and a driving method corresponding to the shift register unit.

The shift register unit, the scan driving circuit, the array substrate, the display device and the driving method provided by the embodiments of the disclosure can speed up the level conversion speed of the first node, and contribute to improving of the response speed of related circuit configurations and the stability of the output signal.

Embodiments of the present disclosure will be described in detail below with reference to the accompanying drawings.

At least an embodiment of the present disclosure provides a shift register unit 100, for example, as shown in FIG. 1, the shift register unit 100 includes an input terminal IN and an output terminal OUT, and includes an input circuit 11, a replacement circuit 12, an output circuit 13, and a pull-down circuit 14.

The input circuit 11 is respectively connected to the input terminal IN and a first node PU, and the input circuit 11 is configured to set the first node PU to an active level when the input terminal IN is at an active level. For example, in some embodiments, in an input phase, the active level (for example, high level) at the input terminal IN can pre-charge the first node PU, that is, the first node PU is set to an active level.

Figure 2:
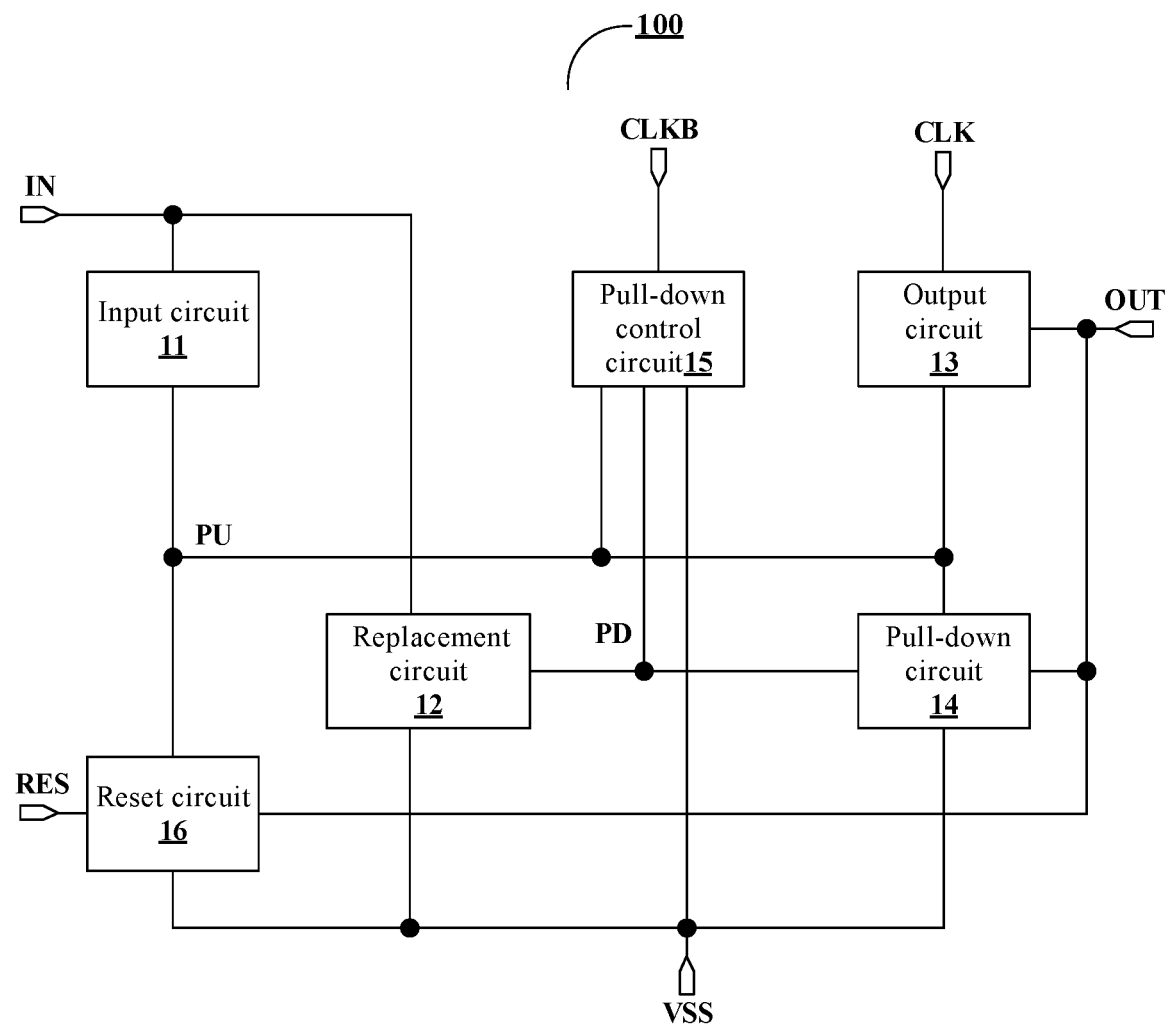
FIG. 2 is a structural block diagram of another shift register unit provided by an embodiment of the present disclosure.

The replacement circuit 12 is respectively connected to the input terminal IN and a second node PD, and the replacement circuit 12 is configured to set the second node PD to an inactive level when the input terminal IN is at an active level. For example, as shown in FIG. 2, in some embodiments, the replacement circuit 12 may be configured to be connected to an inactive level voltage line VSS. In the input phase, the active level at the input terminal IN can enable the second node PD to be connected to the inactive level voltage line VSS, so the second node PD is set to an inactive level.

Figure 4:
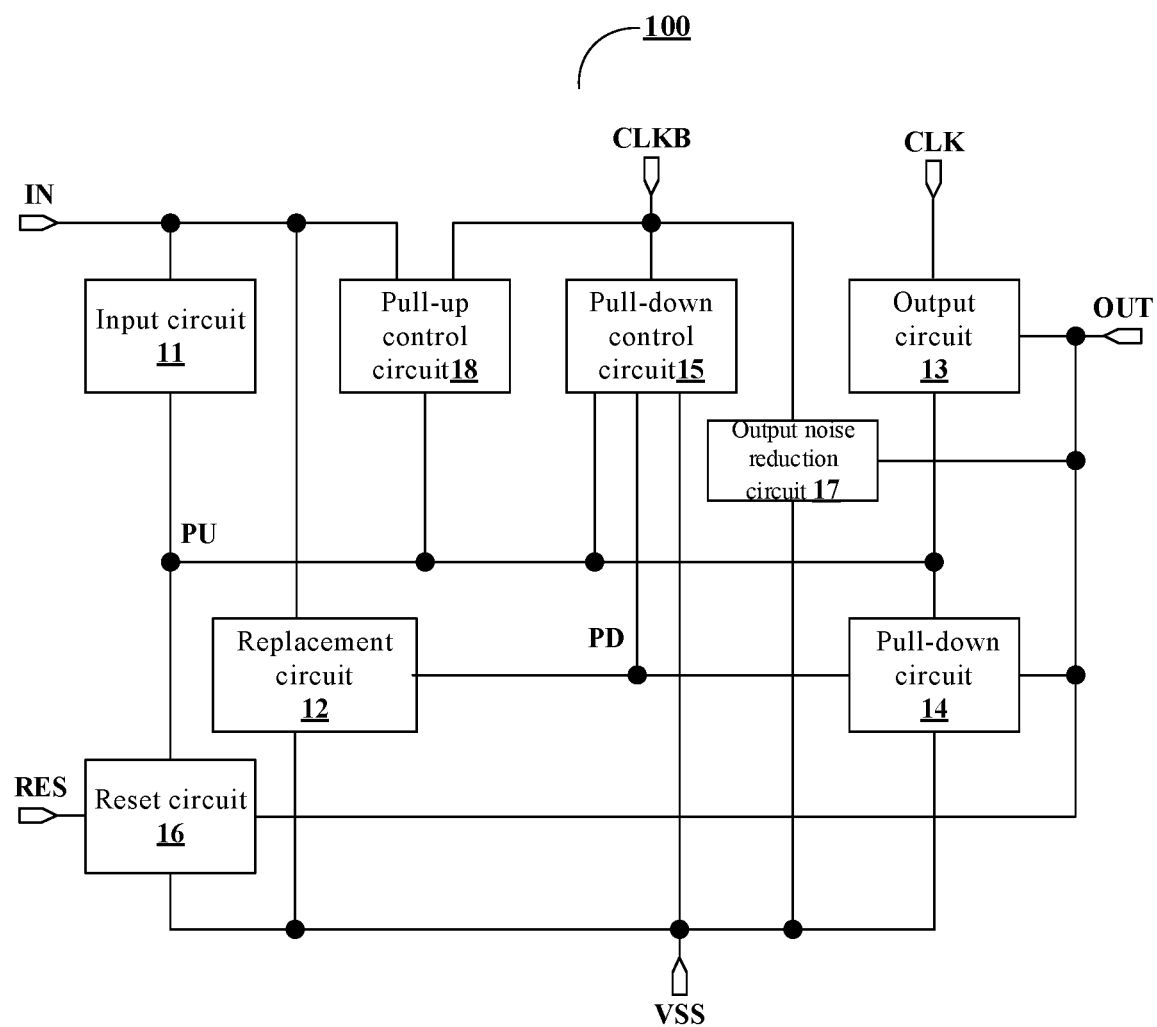
FIG. 4 is a structural block diagram of another shift register unit provided by an embodiment of the present disclosure.

The output circuit 13 is respectively connected to the first node PU and the output terminal OUT, and the output circuit 13 is configured to set the output terminal OUT to an active level by using a clock signal to when the first node PU is at an active level. For example, as shown in FIG. 2 or FIG. 4, in some embodiments, the output circuit 13 may be configured to be connected to a first clock signal line CLK. In an output phase, the active level at the first node PU can enable the output terminal OUT to be electrically connected to the first clock signal line CLK, so the clock signal input from the first clock signal line CLK can be provided to the output terminal OUT, that is, the output terminal OUT is set to an active level.

The pull-down circuit 13 is respectively connected to the first node PU, the output terminal OUT and the second node PD, and the pull-down circuit 14 is configured to set the first node PU and the output terminal OUT to an inactive level when the second node PD is at an active level. For example, as shown in FIG. 2, in some embodiments, the pull-down circuit 13 may be configured to be connected to the inactive level voltage line VSS. In a reset phase, the active level at the second node PD can enable the first node PU and output terminal OUT to be connected to the inactive level voltage line VSS, so the first node PU and output terminal OUT are set to an inactive level.

It should be noted that the active level and the inactive level in the present disclosure respectively refer to two different pre-configured voltage ranges (both ranges are based on the voltage of a common terminal) for specific circuit nodes. In an example, the active levels of nodes in all circuits are high levels of the digital circuit in which the nodes are located. In another example, the active levels of nodes in all circuits are low levels of the digital circuit in which the nodes are located. In another example, the active level at the input terminal IN is the low level of the digital circuit in which the input terminal IN is located, while the active levels at the output terminal OUT, the first node PU and the second node PD are the high levels of the digital circuit. Of course, the setting of the active level and the inactive level may not be limited to the above example.

The shift register unit provided by the embodiments of the present disclosure, can set the second node to an inactive level in a case where the input circuit set the first node to an active level by providing a replacement circuit, so the obstacle caused by the pull-down circuit during the process of setting the first node to an active level can be reduced, and the problem that the level conversion of the pull-down node (second node) in the shift register unit can easily adversely affect the level conversion of the pull-up node (first node) can be solved. The shift register unit provided by the embodiments of this disclosure can speed up the level conversion speed of the first node, and contribute to improving of the response speed of the relevant circuit configuration and the stability of the output signal.

For example, in an embodiment of the present disclosure, as shown in FIG. 2, the shift register unit 100 may also include a pull-down control circuit 15. The pull-down control circuit 15 is respectively connected to the first node PU and the second node PD, and is configured to set the second node PD to an inactive level when the first node PU is at an active level, and use a clock signal to set the second node PD to an active level when the first node PU is at an inactive level. For example, as shown in FIG. 2, in some embodiments, the pull-down control circuit 15 may be configured to connect to the second clock signal line CLKB and connect to the inactive level voltage line VSS. For example, in the output phase, the active level at the first node PU can enable the second node PD to be connected to the inactive level voltage line VSS, so the second node PD is set to an inactive level; in the reset phase, the first node PU is at an inactive level, the clock signal input from the second clock signal line CLKB is at an active level, and the cooperation of the first node PU and the clock signal can set the second node PD to an active level.

For example, in an embodiment of the present disclosure, as shown in FIG. 2, the shift register unit 100 may also include a reset terminal RES, and the shift register unit 100 may also include a reset circuit 16. The reset circuit 16 is respectively connected to the reset terminal RES, the first node PU and the output terminal OUT, and the reset circuit 16 is configured to set the first node PU and the output terminal OUT to inactive levels when the reset terminal RES is at an active level. For example, as shown in FIG. 2, in some embodiments, the reset circuit 16 may be configured to be electrically connected to the inactive level voltage line VSS. In the reset phase, the active level of the reset terminal RES can enable the first node PU and the output terminal OUT to be connected to the inactive level voltage line VSS, so the first node PU and the output terminal OUT can be set to inactive levels.

Figure 3:
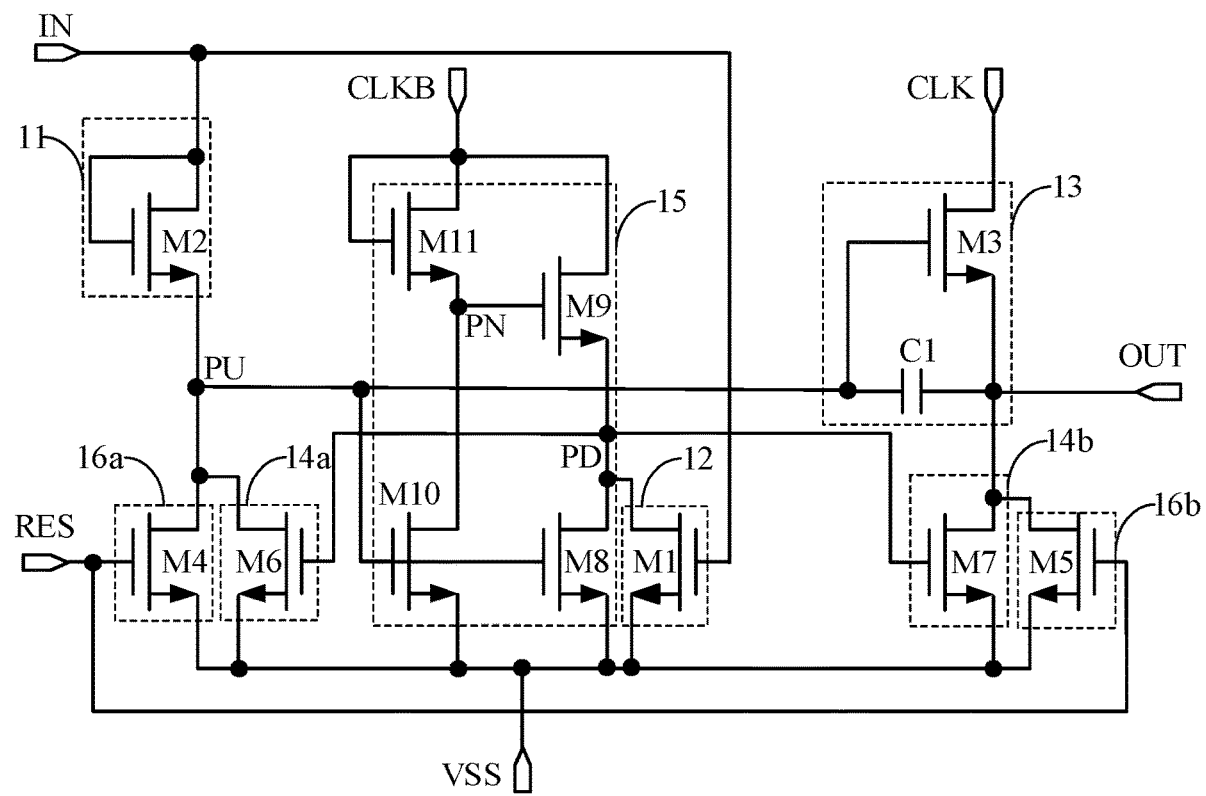
FIG. 3 is a circuit structural diagram of a shift register unit provided by an embodiment of the present disclosure.

For example, the shift register unit 100 as shown in FIG. 2 may be implemented as the circuit structure as shown in FIG. 3. As shown in FIG. 3, the shift register unit includes the input circuit 11, the replacement circuit 12, the output circuit 13, the pull-down circuit 14 (including a first part 14a and a second part 14b), the pull-down control circuit 15, and the reset circuit 16 (including a first part 16a and a second part 16b).

For example, as shown in FIG. 3, the input circuit 11 may include a second transistor M2. A gate electrode of the second transistor M2 is connected to the input terminal IN, a first electrode of the second transistor M2 is connected to the input terminal IN, and a second electrode of the second transistor M2 is connected to the first node PU. It should be noted that, according to the different specific type of the transistor, the connection relationship of the first electrode and the connection relationship of the second electrode may be respectively set to match the direction of the current flowing through the transistor. In a case where the source electrode of the transistor and the drain electrode of the transistor are symmetrical, the source electrode and the drain electrode may be considered as two electrodes that are not particularly distinguished. For example, in a case where the input terminal IN is at a high level, the second transistor M2 is turned on under the control of the high level of the gate electrode, and the first node PU is pulled up to the high level, thereby realizing the above-described function of setting the first node PU to an active level when the input terminal IN is at an active level. For example, in an embodiment, an electrode connected to the input terminal IN in the first electrode and the second electrode of the second transistor M2 may not be connected to the input terminal IN, but may be connected to a voltage terminal capable of providing an active level to the first node, for example, the terminal may provide a direct current high level, and the above described functions may be implemented as well. Of course, the circuit configuration of the input circuit 11 may not be limited to the above form.

For example, as shown in FIG. 3, the replacement circuit 12 may include a first transistor M1. A gate electrode of the first transistor M1 is connected to the input terminal IN, a first electrode of the first transistor M1 is connected to the second node PD, and a second electrode of the first transistor M1 is connected for the inactive level of the second node PD, and for example, may be connected to the inactive level voltage line VSS that can provide an inactive level to the second node PD. For example, in a case where the input terminal IN is at a high level, the first transistor M1 is turned on under the control of the high level of the gate electrode, and the second node PD is pulled down to a low level, thereby realizing the above-described function of setting the second node PD to an inactive level when the input terminal IN is at an active level. Of course, the circuit configuration of the replacement circuit 12 may not be limited to the above form.

For example, as shown in FIG. 3, the output circuit 13 may include a third transistor M3 and a first capacitor C1. A gate electrode of the third transistor M3 is connected to the first node PU, a first electrode of the third transistor M3 is connected to the first clock signal line CLK, and a second electrode of the third transistor M3 is connected to the output terminal OUT. A first terminal of the first capacitor C1 is connected to the first node PU, and a second terminal of the first capacitor C1 is connected to the output terminal OUT. In an example of the present disclosure, one of a positive phase clock signal and an inverted clock signal and the other one of them may be respectively loaded on the first clock signal line CLK and the second clock signal line CLKB, that is, the clock signal loaded on the first clock signal line CLK and the clock signal loaded on the second clock signal line CLKB are mutually inverted signals. For example, when the first node PU is at a high level, the third transistor M3 is turned on under the control of the high level of the gate electrode, so the output terminal OUT may be pulled up to a high level by using the high level at the first clock signal line CLK, thereby realizing the above-described function of setting the output terminal OUT to an active level by using a clock signal when the first node PU is at an active level. Of course, the circuit configuration of the output circuit 13 may not be limited to the above form.

For example, as shown in FIG. 3, the pull-down circuit 14 may include a sixth transistor M6 and a seventh transistor M7. A gate electrode of the sixth transistor M6 is connected to the second node PD, a first electrode of the sixth transistor M6 is connected to the first node PU, and a second electrode of the sixth transistor M6 is connected for the inactive level of the first node, and for example, the second electrode of the sixth transistor M6 may be connected to the inactive level voltage line VSS that can provide an inactive level to the first node PU. A gate electrode of the seventh transistor M7 is connected to the second node PD, a first electrode of the seventh transistor M7 is connected to the output terminal OUT, and a second electrode of the seventh transistor M7 is connected for the inactive level of the output terminal, and for example, the second electrode of the seventh transistor M7 may be connected to the inactive level voltage line VSS that can provide an inactive level to the output terminal OUT. For example, when the second node PD is at a high level, the sixth transistor M6 and the seventh transistor M7 are turned on under the control of the high level of the gate electrode, so the first node PU and the output terminal OUT may be pulled down to a low level, to realize the above-described function of setting the first node PU and the output terminal OUT to inactive levels when the second node PD is at an active level. Of course, the circuit configuration of the pull-down circuit 14 may not be limited to the above form.

For example, as shown in FIG. 3, the pull-down control circuit 15 may include an eighth transistor M8, a ninth transistor M9, a tenth transistor M10, and an eleventh transistor M11. A gate electrode of the eighth transistor M8 is connected to the first node PU, a first electrode of the eighth transistor M8 is connected to the second node PD, a second electrode of the eighth transistor M8 is connected for the inactive level of the second node PD, and for example, the second electrode of the eighth transistor M8 may be connected to the inactive level voltage line VSS that can provide an inactive level to the second node PD. A gate electrode of the ninth transistor M9 is connected to a third node PN, a first electrode of the ninth transistor M9 is connected to the second clock signal line CLKB, and a second electrode of the ninth transistor M9 is connected to the second node PD. A gate electrode of the tenth transistor M10 is connected to the first node PU, a first electrode of the tenth transistor M10 is connected to the third node PN, a second electrode of the tenth transistor M10 is connected for a gate turn-off voltage, and for example, the second electrode of the tenth transistor M10 may be connected to the inactive level voltage line VSS that can provide the gate turn-off voltage, which may turn off the ninth transistor M9. A gate electrode and a first electrode of the eleventh transistor M11 are respectively connected to the second clock signal line CLKB, and a second electrode of the eleventh transistor M11 is connected to the third node PN.

For example, when the first node PU is at a high level, the eighth transistor M8 and the tenth transistor M10 are turned on under the control of the high level of the gate electrode, and the second node PD and the third node PN are pulled down to a low level. However, when the first node PU is at a low level, the eleventh transistor M11 can be turned on during a period in which the second clock signal line CLKB is at a high level in each clock cycle, thereby pulling up the third node PN to a high level, so the ninth transistor M9 is turned on under the control of the high level of the gate electrode thereof, to pull up the second node PD to a high level. The above circuit structure can realize the above-described function that the second node PD is set to an inactive level when the first node PU is at an active level, and the second node PD is set to an active level by using a clock signal when the first node PU is at an inactive level. Of course, the circuit configuration of the pull-down control circuit 15 may not be limited to the above form.

For example, as shown in FIG. 3, the reset circuit 16 may include a fourth transistor M4 and a fifth transistor M5. A gate electrode of the fourth transistor M4 is connected to the reset terminal RES, a first electrode of the fourth transistor M4 is connected to the first node PU, and a second electrode of the fourth transistor M4 is connected for the inactive level of the first node PU, and for example, the second electrode of the fourth transistor M4 may be connected to the inactive level voltage line VSS that can provide an inactive level to the first node PU. A gate electrode of the fifth transistor M5 is connected to the reset terminal RES, a first electrode of the fifth transistor M5 is connected to the output terminal OUT, and a second electrode of the fifth transistor M5 is connected for the inactive level of the output terminal OUT, and for example, the second electrode of the fifth transistor M5 may be connected to the inactive level voltage line VSS that can provide an inactive level to the output terminal OUT. For example, when the reset terminal RES is at a high level, the fourth transistor M4 and the fifth transistor M5 are turned on under the control of the high level of the gate electrodes thereof, to pull down the first node PU and the output terminal OUT to a low level, thereby achieving the above-described function of setting the first node PU and the output terminal OUT to inactive levels when the reset terminal RES is at an active level. Of course, the circuit configuration of the reset circuit 16 may not be limited to the above form.

For example, in an embodiment of the present disclosure, as shown in FIG. 4, the shift register unit 100 may further include an output noise reduction circuit 17. The output noise reduction circuit 17 is respectively connected to the second clock signal line CLKB and the output terminal OUT, and is configured to set the output terminal OUT to an inactive level when the second clock signal line CLKB is at an active level. For example, as shown in FIG. 4, in some embodiments, the output noise reduction circuit 17 may be configured to be electrically connected to the inactive level voltage line VSS. In the reset phase, the active level at the second clock signal line CLKB can enable the output terminal OUT to be electrically connected to the inactive level voltage line VSS, so the output terminal OUT can be set to an inactive level.

Figure 5:
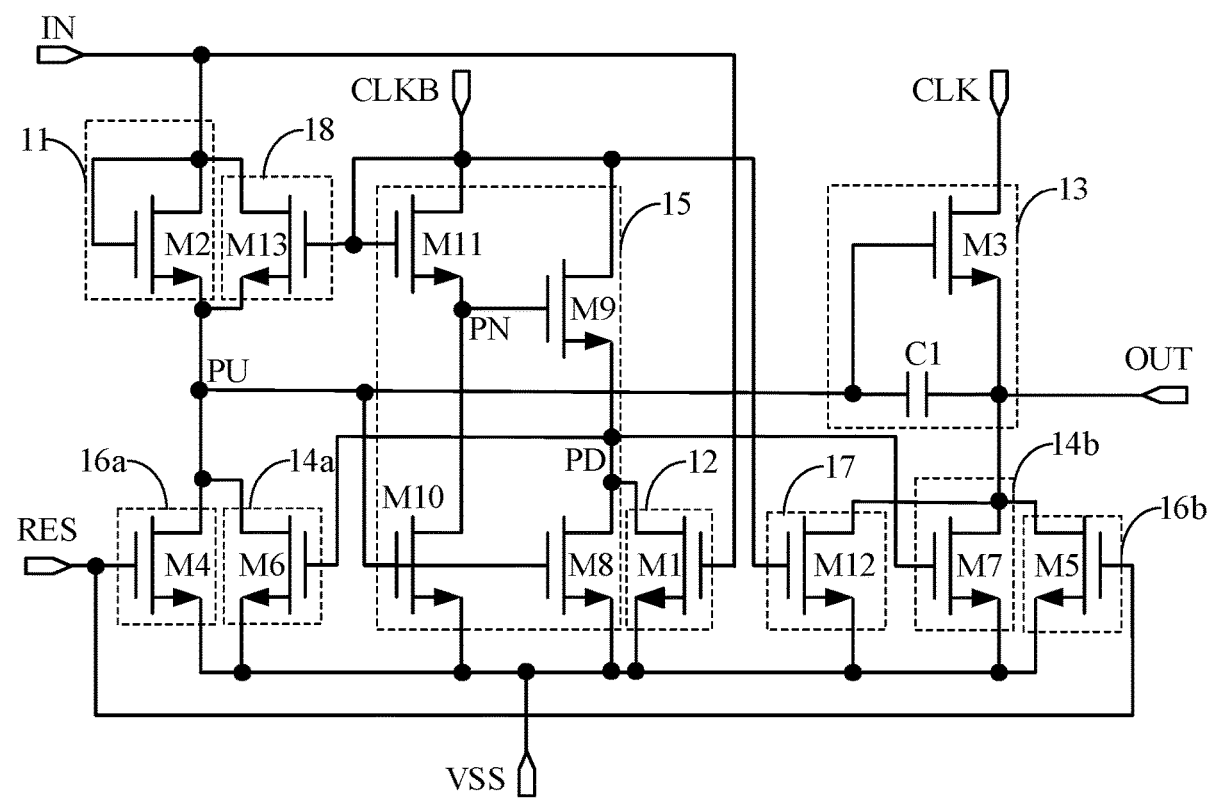
FIG. 5 is a circuit structural diagram of another shift register unit provided by an embodiment of the present disclosure.

For example, as shown in FIG. 5, the output noise reduction circuit 17 may include a twelfth transistor M12. A gate electrode of the twelfth transistor M12 is connected to the second clock signal line CLKB, a first electrode of the twelfth transistor M12 is connected to the output terminal OUT, and a second electrode of the twelfth transistor M12 is connected for the inactive level of the output terminal OUT, and for example, the second electrode of the twelfth transistor M12 may be connected to the inactive level voltage line VSS that can provide an inactive level to the output terminal OUT. For example, when the second clock signal line CLKB is at a high level, the twelfth transistor M12 is turned on under the control of the high level of the gate electrode, thereby pulling down the output terminal OUT to a low level. The twelfth transistor M12 is capable of releasing the noise voltage of the output terminal OUT in the clock cycle, and helping to stabilize the potential of the output terminal OUT.

For example, in an embodiment of the present disclosure, as shown in FIG. 4, the shift register unit 100 may further include a pull-up control circuit 18. The pull-up control circuit 18 is respectively connected to the second clock signal line CLKB, the input terminal IN and the first node PU, and is configured to charge the first node PU or reduce noise of the first node PU. For example, in the input phase, the active level at the second clock signal line CLKB can enable the input terminal IN to be electrically connected to the first node PU, so the active level of the input terminal IN can charge the first node PU; in the reset phase, the active level at the second clock signal line CLKB can enable the input terminal IN to be electrically connected to the first node PU; the input terminal IN is at an inactive level at this time, so the first node PU can be discharged through the input terminal IN to realize noise reduction.

For example, as shown in FIG. 5, the pull-up control circuit 18 may include a thirteenth transistor M13. A gate electrode of the thirteenth transistor M13 is connected to the second clock signal line CLKB, a first electrode of the thirteenth transistor M13 is connected to the input terminal IN, and a second electrode of the thirteenth transistor M13 is connected to the first node PU. For example, when the second clock signal line CLKB is at a high level, the thirteenth transistor M13 is turned on under the control of the high level of the gate electrode thereof, thereby electrically connecting the input terminal IN and the first node PU to each other. The thirteenth transistor M13 can help the input circuit 11 to pull up the first node PU when the input terminal IN is at a high level, and can release the noise voltage of the first node PU in the clock cycle and help to stabilize the potential of the first node PU.

It should be noted that, the transistors as shown in FIG. 3 and FIG. 5 are all N-type transistors, that is, can be formed by the same fabrication process to reduce the manufacturing cost. For ease of understanding, in the embodiments of the present disclosure, all of the transistors are N-type transistors, and it is taken as an example for description that a high level is taken as an active level and a low level is taken as an inactive level. Of course, it is also possible to use a low level as an active level, a high level as an inactive level, and/or a setting in which some or all of the N-type transistors are replaced with P-type transistors. For example, the following changes can be made on the basis of the embodiment as shown in FIG. 3 or FIG. 5: all the transistors as shown in FIG. 3 or FIG. 5 are provided as P-type transistors, and the high levels of the related signals are exchanged with the low level of the related signals, and for example, the inactive level voltage line VSS is changed from outputting a low level to outputting a high level. It is easy to understand that such a change can cause the high level of the circuit to change to a low level, the low level to change to a high level, the pulling-up of the potential to change to the pulling-down of the potential, and the pulling-down of potential to change to the pulling-up of potential, while the essence of the circuit's working principle remains unchanged. Therefore, the changed circuit structure, circuit timing, and circuit operation principle can be understood by referring to the above embodiments, and details are not described in this aspect here again.

Figure 6:
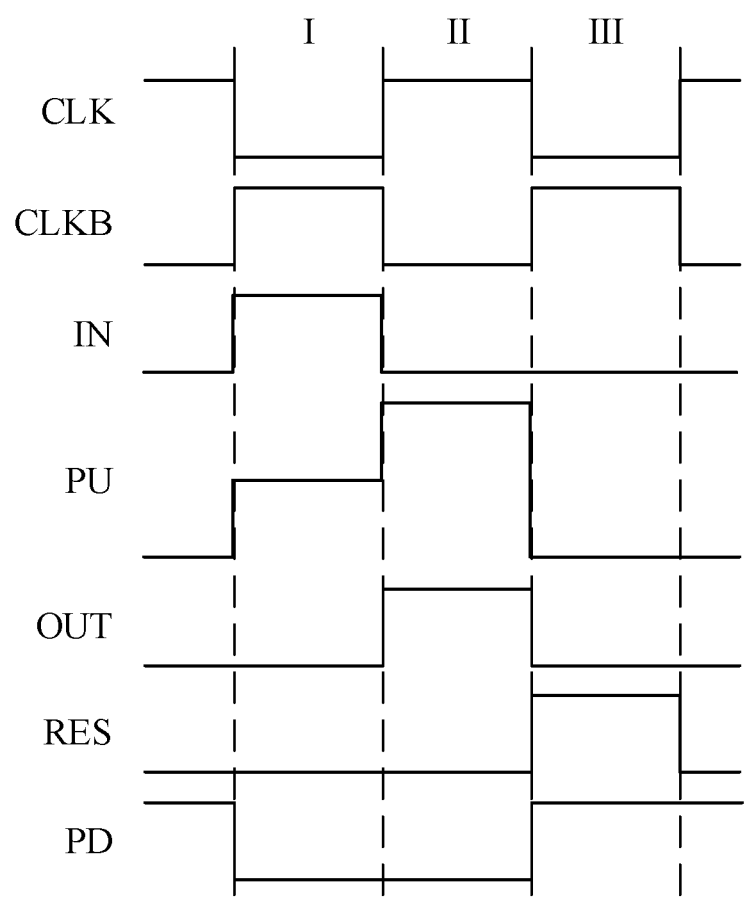
FIG. 6 is a circuit timing diagram of a shift register unit provided by an embodiment of the present disclosure.

FIG. 6 is a circuit timing diagram of the shift register unit as shown in FIG. 5. As shown in FIG. 6, the working phase of the above shift register unit mainly includes an input phase I, an output phase II, and a reset phase III. The working principle of the shift register unit provided by an embodiment of the present disclosure will be described below with reference to FIGS. 5 and 6.

Before the input phase I and after the reset phase III, with the periodic alternation between the high level and the low level of the second clock signal line CLKB, the third node PN is maintained at a high level under the periodic pull-up of the eleventh transistor M11, and the second node PD is maintained at a high level. Therefore, the first node PU is maintained at a low level under the pull-down of the sixth transistor M6 and the periodic pull-down of the thirteenth transistor M13, and the output terminal OUT is maintained at a low level under the pull-down action of the seventh transistor M7 and the periodic pull-down of the twelfth transistor M12, that is, the shift register unit is at a reset state.

In the input phase I, the input terminal IN is at a high level, the first transistor M1 and the second transistor M2 are turned on to respectively enable the second node PD to be pulled down to a low level, and enable the first node PU to be pulled up to a high level. Therefore, the sixth transistor M6 and the seventh transistor M7 are turned off, and the third transistor M3, the eighth transistor M8, and the tenth transistor M10 are turned on. The eleventh transistor M11 is turned on by the high level of the second clock signal line CLKB. For example, for the design of the transistor, the tenth transistor M10 and the eleventh transistor M11 can be configured (for example, by the settings such as a size ratio, a threshold voltage, and the like of the tenth transistor M10 and the eleventh transistor M11) to enable the potential of the third node PN to be pulled down to a low level when both the tenth transistor M10 and the eleventh transistor M11 are turned on, and the low level does not enable the ninth transistor M9 to be turned on.

At the same time, the twelfth transistor M12 and the thirteenth transistor M13 are turned on under the control of the high level of the second clock signal line CLKB, and the thirteenth transistor M13 may further pull up the potential of the first node PU. The output terminal OUT is kept at a low level under the pull-down of the third transistor M3 and the twelfth transistor M12. The first terminal of the first capacitor C1 is at a high level of the first node PU, and the second terminal of the first capacitor C1 is at a low level of the output terminal OUT, so the first capacitor C1 is in the state of being charged.

In the output phase II, the input terminal IN is at a low level, the second clock signal line CLKB is at a low level, and the first clock signal line CLK is at a high level. Under the charge retention effect of the first capacitor C1, the first node PU jumps to a higher level than the current potential with the first clock signal line CLK being changed from a low level to a high level. This operation enables the third transistor M3 to be turned-on more fully, and quickly completes pulling-up of the potential of the output terminal OUT, that is, the output terminal OUT outputs the gate driving signal.

In the reset phase III, the reset terminal RES is turned to a high level, the second clock signal line CLKB is at a high level, and the first clock signal line CLK is at a low level. Under the control of the high level of the reset terminal RES, the fourth transistor M4 and the fifth transistor M5 are turned on, to pull down the potential of the first node PU and the potential of the output terminal OUT, respectively. Because the first node PU is pulled down to a low level, the eighth transistor M8 and the tenth transistor M10 are turned off, the eighth transistor M8 stops pulling down the potential of the second node PD, and the tenth transistor M10 stops pulling down the potential of the third node PN. Under the control of the high level of the second clock signal line CLKB, the eleventh transistor M11 is turned on to set the third node PN to a high level, and the ninth transistor M9 is turned on to set the second node PD to a high level. The sixth transistor M6 and the seventh transistor M7 are turned on under the control of the high level of the second node PD, so the first node PU and the output terminal OUT are set to low levels, that is, the output of the gate driving signal is stopped. Thereafter, the shift register unit remains in the reset state until the beginning of the next input phase I.

As described above, in a case where the pull-down effect of the first transistor M1 on the potential of the second node PD in the input phase I is lost, the pull-up effect of the second transistor M2 on the potential of the first node PU is affected by the pull-down effect of the sixth transistor M6 on the potential of the first node PU, to cause the rise speed of the potential of the first node PU and the decrease speed of the potential of the second node PD to be slow, and it may even occur that the first node PU does not reach the required high level at the end of the input phase I, that is, a work exception or error occurs. And because the first transistor M1 pulls down the potential of the second node PD in the input phase I, the potential of the second node PD is quickly set to a low level, and the pull-up effect of the second transistor M2 on the potential of the first node PU is hardly be affected by the pull-down effect of the sixth transistor M6 on the potential at the first node PU. Therefore, the shift register unit provided by the embodiments of the present disclosure can speed up the level conversion speed of the first node PU, and contributes to improving of the response speed of the relevant circuit structure and the stability of the output signal.

It should be noted that, in the embodiments of the present disclosure, the thirteenth transistor M13 and the fourth transistor M4 can pull down the potential of the first node PU in the reset phase III. Therefore, in other implementations, only one of the thirteenth transistor M13 and the fourth transistor M4 may be reserved with the other one is removed, and the workflow of the above shift register unit can still be performed normally. The fifth transistor M5 and the twelfth transistor M12 described above can both pull down the potential of the output terminal OUT in the reset phase III, but even if one or both of them are removed, the potential of the output terminal OUT may be pulled down by the seventh transistor M7. Therefore, in other implementations, one or both of the fifth transistor M5 and the twelfth transistor M12 can be removed, and the workflow of the above-described shift register unit can still be performed normally.

Figure 7:
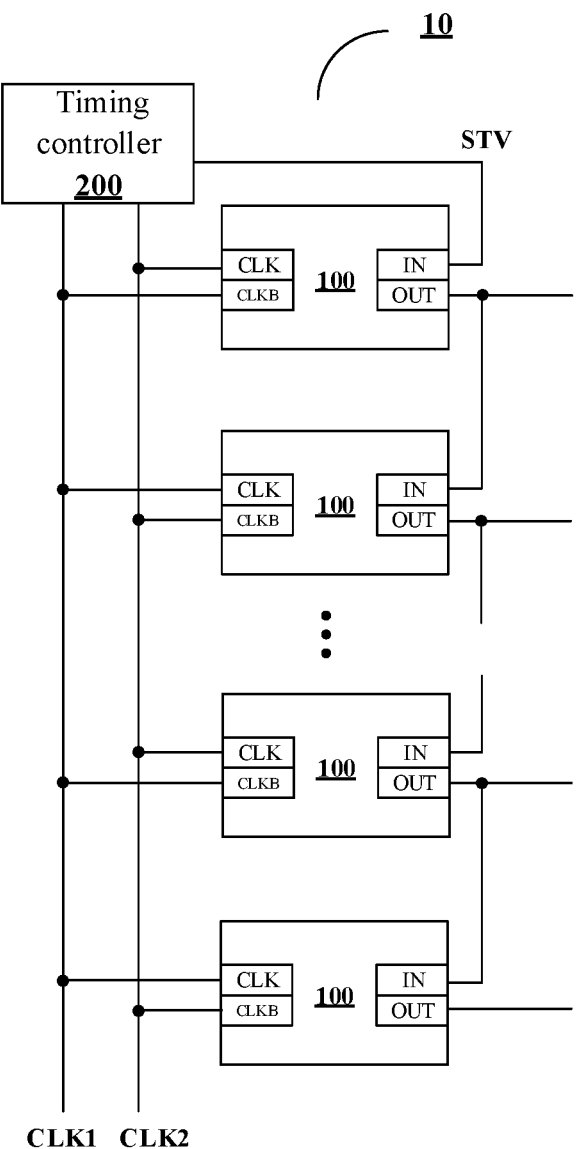
FIG. 7 is a schematic diagram of a scan driving circuit provided by an embodiment of the present disclosure.
Figure 8:
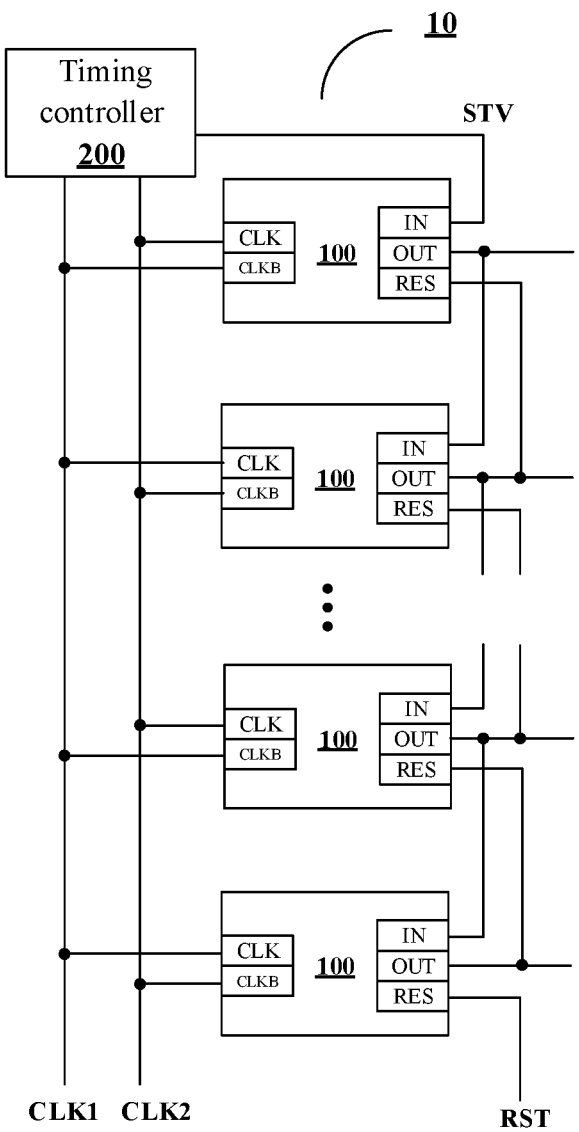
FIG. 8 is a schematic diagram of another scan driving circuit provided by an embodiment of the present disclosure.

An embodiment of the present disclosure further provides a scan driving circuit 10, as shown in FIGS. 7 and 8, the scan driving circuit 10 includes a plurality of cascaded shift register units 100, and each of the shift register units 100 can adopt the shift register 100 provided in the above embodiment. The scan driving circuit 10 can be directly integrated on an array substrate of the display device by using the same process as the thin film transistor to realize the progressive scan driving function.

For example, as shown in FIG. 7 and FIG. 8, in the gate driving circuit 10, an input terminal IN of a shift register unit in each of remaining stages except for the first stage is connected to an output terminal OUT of a shift register unit in a previous stage. For example, the input terminal IN of shift register unit in the first stage may be configured to receive a trigger signal STV.

For example, as shown in FIG. 8, in a case where the shift register unit 100 includes the reset terminal RES, a reset terminal RES of a shift register unit in each of remaining stages except for the last stage is connected to an output terminal OUT of a shift register unit in a next stage. For example, the reset terminal RES of the shift register unit in the last stage may be configured to receive the reset signal RST.

In order to achieve correct signal timing, the first clock signal line to which the odd-numbered shift register unit is connected is the second clock signal line to which the even-numbered shift register unit is connected, and the second clock signal line to which the odd-numbered shift register unit is connected is the first clock signal line to which the even-numbered shift register unit is connected. That is, except for the shift register unit in the first stage, the manner in which the shift register unit in each stage is connected to the clock signal line is opposite to the manner in which the shift register unit in the previous stage is connected to the clock signal line. The scan driving circuit can also have better circuit performance based on the better circuit performance obtained by shift register unit.

For example, as shown in FIGS. 7 and 8, the clock signals can be provided by two system clock signals CLK1 and CLK2 to the clock signal lines (the first clock signal line CLKA and the second clock signal line CLKB) in each shift register unit 100. For example, the first clock signal line CLK of the shift register unit 100 in the first stage inputs the signal CLK2, and the second clock signal line CLKB of the shift register unit 100 in the first stage inputs the signal CLK1; the first clock signal line CLK of the shift register unit 100 in the second stage inputs the signal CLK1, and the second clock signal line CLKB of the shift register unit 100 in the second stage inputs the signal CLK2; in the same way, the first clock signal line CLK of the shift register unit 100 in the (2N-1)th stage inputs the signal CLK2, and the second clock signal line CLKB of the shift register unit 100 in the (2N-1)th stage inputs the signal CLK1; and the first clock signal line CLK of the shift register unit 100 in the (2N)th stage inputs the signal CLK1, and the second clock signal line CLKB of the shift register unit 100 in the (2N)th stage inputs the signal CLK2. For example, in this configuration, the signal CLK1 and the signal CLK2 may use a 50% duty cycle timing signal.

For example, as shown in FIGS. 7 and 8, the scan driving circuit 10 may further include a timing controller 200. The timing controller 200 is configured, for example, to provide clock signals (CLK1, CLK2) to the shift register units 100 in each stage, and the timing controller 200 may also be configured to provide the trigger signal STV and the reset signal RST.

The technical effects of the scan driving circuit 10 provided in the embodiments of the present disclosure may refer to the corresponding description of the shift register unit 100 in the above embodiments, and details are not described in this aspect here again.

Figure 9:
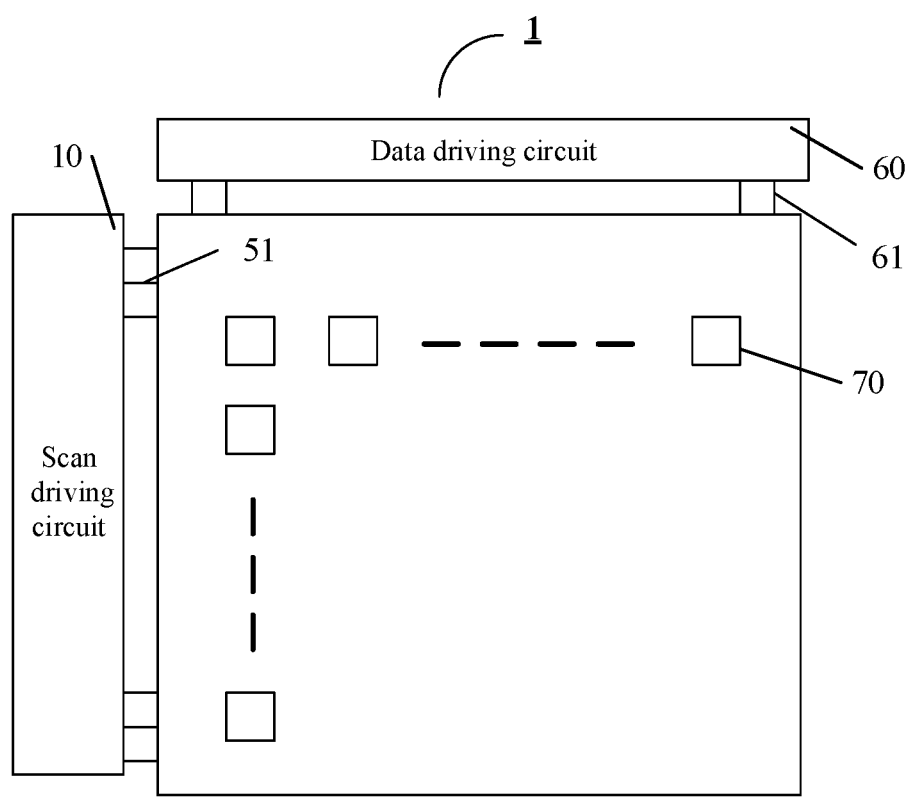
FIG. 9 is a schematic diagram of an array substrate provided by an embodiment of the present disclosure.

An embodiment of the present disclosure also provides an array substrate 1, as shown in FIG. 9. The array substrate 1 includes the scan driving circuit 10 provided by the embodiments of the present disclosure. For example, the array substrate 1 includes an array included a plurality of pixel units 70. For example, the array substrate 1 may further include a data driving circuit 60. The data driving circuit 60 is configured to provide data signals to the pixel array; the scan driving circuit 10 is configured to provide a gate driving signal to the pixel array. The data driving circuit 60 is electrically connected to the pixel units 70 through data lines 61, and the scan driving circuit 10 is electrically connected to the pixel units 70 through gate lines 51. In an example, the array substrate is provided with a plurality of scan driving circuits of any one of the above-described types outside the display area. The array substrate can also have better performance based on the superior circuit performance achieved by the shift register unit or the scan driving circuit. The technical effects of the array substrate 1 provided in the embodiments of the present disclosure may refer to the corresponding description of the shift register unit 100 in the above embodiments, and details are not described in this aspect here again.

An embodiment of the present disclosure further provides a display device comprising the shift register unit provided by any one of the above embodiments, the scan driving circuit provided by any one of the above embodiments, or the array substrate provided by any one of the above embodiments. The display device in the embodiments of the present disclosure may be any product or component having a display function, such as a display panel, a mobile phone, a tablet computer, a television, a display, a notebook computer, a digital photo frame, a navigator, and the like. The display device can also have better performance based on the good performance achieved by the shift register unit, the scan driving circuit or the array substrate. The technical effect of the display device provided in the embodiments of the present disclosure may refer to the corresponding description of the shift register unit 100 in the above embodiments, and details are not described in this aspect here again.

An embodiment of the present disclosure also provide a driving method that may be used to drive the shift register unit 100 provided by the embodiments of the present disclosure. For example, the driving method may include the following operations.

In the input phase, the input circuit 11 sets the first node PU to an active level when the input terminal IN is at an active level, and the replacement circuit 12 sets the second node PD to an inactive level when the input terminal IN is at an active level.

In the output phase, the output circuit 13 sets the output terminal OUT to an active level by using the clock signal when the first node PU is at an active level.

In the reset phase, the pull-down circuit 14 sets the first node PU and the output OUT to an inactive level when the second node PD is at an active level.

It should be noted that, the detailed description of the driving method and technical effects, may refer to the description of the operation principle of the shift register unit 100 in the embodiments of the present disclosure, and details are not described in this aspect here again.

What are described above is related to the illustrative embodiments of the disclosure only and not limitative to the scope of the disclosure, the scopes of the disclosure are defined by the accompanying claims.

What is claimed is:

1. A shift register unit, comprising an input terminal, an output terminal, an input circuit, a replacement circuit, an output circuit, a pull-down circuit, a pull-down control circuit, a reset terminal, a reset circuit, and a pull-up control circuit, the input circuit comprises a second transistor, the output circuit comprises a third transistor and a first capacitor, the reset circuit comprises a fourth transistor and a fifth transistor, the pull-down circuit comprises a sixth transistor and a seventh transistor, and the pull-down control circuit comprises an eighth transistor, a ninth transistor, a tenth transistor, and an eleventh transistor;

wherein the input circuit is respectively connected to the input terminal and a first node, and is configured to set the first node to an active level of the first node when the input terminal is at an active level of the input terminal;

the replacement circuit is respectively connected to the input terminal and a second node, and is configured to set the second node to an inactive level of the second node when the input terminal is at the active level of the input terminal;

the output circuit is respectively connected to the first node and the output terminal, and is configured to set the output terminal to an active level of the output terminal by using a clock signal when the first node is at the active level of the first node;

the pull-down circuit is respectively connected to the first node, the output terminal, and the second node, and is configured to set the first node to an inactive level of the first node and the output terminal to an inactive level of the output terminal when the second node is at an active level of the second node;

the pull-down control circuit is respectively connected to the first node and the second node, and is configured to set the second node to the inactive level of the second node when the first node is at the active level, and use the clock signal to set the second node to the active level when the first node is at the inactive level of the first node;

the reset circuit is respectively connected to the reset terminal, and the first node and the output terminal, and is configured to set the first node to an inactive level of the first node and the output terminal to an inactive level of the output terminal when the reset terminal is at an active level of the reset terminal;

a gate electrode of the second transistor is connected to the input terminal, a first electrode of the second transistor is connected to the input terminal or connected to receive the active level of the first node, and a second electrode of the second transistor is connected to the first node;

a gate electrode of the third transistor is connected to the first node, a first electrode of the third transistor is connected to a first clock signal line, and a second electrode of the third transistor is connected to the output terminal;

a first terminal of the first capacitor is connected to the first node, and a second terminal of the first capacitor is connected to the output terminal;

a gate electrode of the fourth transistor is connected to the reset terminal, a first electrode of the fourth transistor is connected to the first node, and a second electrode of the fourth transistor is connected to receive the inactive level of the first node;

a gate electrode of the fifth transistor is connected to the reset terminal, a first electrode of the fifth transistor is connected to the output terminal, and a second electrode of the fifth transistor is connected to receive the inactive level of the output terminal;

a gate electrode of the sixth transistor is connected to the second node, a first electrode of the sixth transistor is connected to the first node, and a second electrode of the sixth transistor is connected to receive the inactive level of the first node;

a gate electrode of the seventh transistor is connected to the second node, a first electrode of the seventh transistor is connected to the output terminal, and a second electrode of the seventh transistor is connected to receive the inactive level of the output terminal;

a gate electrode of the eighth transistor is connected to the first node, a first electrode of the eighth transistor is connected to the second node, and a second electrode of the eighth transistor is connected to receive the inactive level of the second node;

a gate electrode of the ninth transistor is connected to a third node, a first electrode of the ninth transistor is connected to a second clock signal line, and a second electrode of the ninth transistor is connected to the second node;

a gate electrode of the tenth transistor is connected to the first node, a first electrode of the tenth transistor is connected to the third node, and a second electrode of the tenth transistor is connected to receive the inactive level of the second node;

a gate electrode of the eleventh transistor is connected to the second clock signal line, a first electrode of the eleventh transistor is connected to the second clock signal line, and a second electrode of the eleventh transistor is connected to the third node;

wherein the first clock signal line and the second clock signal line are respectively configured to transmit one and other one of a positive phase clock signal and an inverted clock signal; and the pull-up control circuit is respectively connected to the second clock signal line, the input terminal and the first node, and is configured to charge the first node or reduce noise of the first node.

2. The shift register unit according to claim 1, wherein the replacement circuit comprises a first transistor;

a gate electrode of the first transistor is connected to the input terminal, a first electrode of the first transistor is connected to the second node, and a second electrode of the first transistor is connected to receive the inactive level of the second node.

3. The shift register unit according to claim 1, further comprising an output noise reduction circuit, wherein the output noise reduction circuit is respectively connected to the second clock signal line and the output terminal, and is configured to set the output terminal to the inactive level of the output terminal when the second clock signal line is at an active level.

4. The shift register unit according to claim 3, wherein the output noise reduction circuit comprises a twelfth transistor, a gate electrode of the twelfth transistor is connected to the second clock signal line, a first electrode of the twelfth transistor is connected to the output terminal, and a second electrode of the twelfth transistor is connected to receive the inactive level of the output terminal.

5. The shift register unit according to claim 1, wherein the pull-up control circuit comprises a thirteenth transistor, a gate electrode of the thirteenth transistor is connected to the second clock signal line, a first electrode of the thirteenth transistor is connected to the input terminal, and a second electrode of the thirteenth transistor is connected to the first node.

6. A scan driving circuit, comprising a plurality of cascaded shift register units according to claim 1.

7. The scan driving circuit according to claim 6, wherein an input terminal of a shift register unit in each of remaining stages except for a first stage is connected to an output terminal of a shift register unit in a previous stage.

8. An array substrate, comprising the scan driving circuit according to claim 6.

9. A display device, comprising the array substrate according to claim 8.

10. A driving method of the shift register unit according to claim 1, comprising:

in an input phase, by the input circuit, setting the first node to the active level of the first node when the input terminal is at the active level of the input terminal, and by the replacement circuit, setting the second node to the inactive level of the second node when the input terminal is at the active level of the input terminal;

in an output phase, by the output circuit, setting the output terminal to the active level of the output terminal by using a clock signal when the first node is at the active level of the first node; and in a reset phase, by the pull-down circuit, setting the first node to the inactive level of the first node and the output terminal to the inactive level of the output terminal when the second node is at the active level of the second node.

* * * * *